(12) United States Patent
Martius et al.

(10) Patent No.: US 9,612,305 B2
(45) Date of Patent: Apr. 4, 2017

(54) SHIELDING FOR AN ELECTRONIC CIRCUIT

(71) Applicants: Sebastian Martius, Forchheim (DE); Oliver Schwender, Erlangen (DE); Benjamin Sewiolo, Höchstadt (DE)

(72) Inventors: Sebastian Martius, Forchheim (DE); Oliver Schwender, Erlangen (DE); Benjamin Sewiolo, Höchstadt (DE)

(73) Assignee: Siemens Aktiengesellschaft, München (DE)

(*) Notice: Subject to any disclaimer, the term of this patent is extended or adjusted under 35 U.S.C. 154(b) by 742 days.

(21) Appl. No.: 13/866,795

(22) Filed: Apr. 19, 2013

(65) Prior Publication Data

US 2013/0278268 A1   Oct. 24, 2013

(30) Foreign Application Priority Data

Apr. 20, 2012 (DE) .............. 10 2012 206 549

(51) Int. Cl.
*G01V 3/00* (2006.01)
*G01R 33/42* (2006.01)
*H05K 9/00* (2006.01)
*G01R 33/422* (2006.01)

(52) U.S. Cl.
CPC .......... *G01R 33/42* (2013.01); *G01R 33/422* (2013.01); *H05K 9/0086* (2013.01)

(58) Field of Classification Search
CPC ..................................................... G01R 33/42
USPC ................................................ 324/318, 322
See application file for complete search history.

(56) References Cited

U.S. PATENT DOCUMENTS 5,367,261 A    11/1994  Frederick
8,089,331 B2 *  1/2012  Jacobson et al. ........... 336/84 C

FOREIGN PATENT DOCUMENTS

WO    WO 2008051915    5/2008

* cited by examiner

*Primary Examiner* — Louis Arana
(74) *Attorney, Agent, or Firm* — Lempia Summerfield Katz LLC

(57) ABSTRACT

Shielding for an electronic circuit includes at least one substrate. A metal structure is disposed on at least one side of the at least one substrate. The metal structure includes a number of non-contiguous part areas. Adjacent part areas that are disposed on a same side of the substrate are spaced apart from one another by a boundary line running in a serpentine shape.

21 Claims, 3 Drawing Sheets

SHIELDING FOR AN ELECTRONIC CIRCUIT

This application claims the benefit of DE 10 2012 206 549.0, filed on Apr. 20, 2012, which is hereby incorporated by reference.

BACKGROUND

The present embodiments relate to shielding for an electronic circuit.

Magnetic resonance tomography (MRT or MR; also referred to as MRI for Magnetic Resonance Imaging) is an imaging method that may be used in medical diagnostics for presenting structure and function of the tissue and organs. MRT is based physically on the principles of nuclear magnetic resonance and is therefore also referred to as nuclear magnetic resonance tomography.

Slice images of a human or animal body may be created with MRT. The slice images allow the organs and many pathological changes to organs to be assessed. Magnetic resonance tomography is based on strong magnetic fields and also electromagnetic alternating fields in the radio frequency range. Specific atomic nuclei (e.g., the hydrogen nuclei/protons) are resonantly excited in the body with the strong magnetic fields and the electromagnetic alternating fields. The resonantly excited atomic nuclei induce electrical signals in the receiver circuit. No stressful x-rays or other ionizing radiation is generated or used in the device. A basis for the image contrast is different relaxation times of different types of tissue. The different content of hydrogen atoms in the different tissues (e.g., muscle, bones) also contributes to the image contrast.

In addition to the static basic magnetic field, switched gradient magnetic fields in the Kilohertz range and the MR frequency in the upper Megahertz range (e.g., 60-500 MHz and often 123 MHz) are used for MRT. As integration progresses, there is an increasing requirement for the electronics modules such as A/D converters or field programmable gate arrays (FPGAs), for example, to be disposed directly on the highly-sensitive receive coils. In such cases, the electronics modules may interfere with the reception of the MR signals in that the electronics modules emit frequencies or frequency portions in the range of the MR frequency. These electronic components are thus to be shielded accordingly.

The shielding for the electronic modules is to be as high as possible in the range of the MR frequency and is to be as transparent as possible however for the gradient frequency (e.g., the shielding is to possess a lowpass characteristic).

It is known that electronic modules may be shielded with the aid of full-coverage metal boxes or metal covers. The disadvantage, however, is that, on account of the full-coverage metal surfaces, eddy currents may be induced on such shielding. The eddy currents lead to image faults during magnetic resonance tomography. Therefore, the electronics modules causing the interference are disposed at a safe distance and connected to the receive antennas by cables. This increases the complexity of the cabling, which overall has an adverse effect on safety as well as causing the costs of such a solution to rise.

Publication WO 2008/051915 A1 shows shielding of an electronic circuit, in which metal structures are embodied on both sides of a substrate. Each of the metal structures includes non-contiguous part areas with slots lying between.

A cylindrical shield for magnetic resonance antenna is described in publication U.S. Pat. No. 5,367,261 A, in which metal structures with predefined patterns are provided on both sides of a substrate.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an efficient, low-cost and thereby safe option for effectively shielding out electronic modules that cause interference is provided.

The shielding includes at least one substrate. A metal structure is disposed on at least one side of the at least one substrate. The metal structure includes a plurality of non-contiguous part areas. Adjacent part areas of the plurality of non-contiguous part areas disposed on a same side of the substrate are spaced apart from each other by a boundary line running in a serpentine shape. This provides that adjacent edges of the adjacent part areas run in a serpentine shape, through which a serpentine space without metal is formed between the edges. The adjacent part areas are coupled capacitively with one another via the boundary line running in the serpentine shape.

The advantage of this shielding is that the boundary line, because of the serpentine shape, is long. Thereby, a high capacitance is created between the part areas, so that without the use of discrete components, a capacitive coupling may be achieved. For high frequencies, the capacitive coupling represents a short-circuit. For low frequencies, the capacitive coupling represents a no-load situation. Through this, a frequency-selective surface is created in a simple manner. The frequency-selective surface has a lowpass characteristic. This provides that the shielding provides a good shielding for high frequencies and, for example, the MR frequency, while low frequencies and, for example, the frequency of the MR gradient field are allowed to pass through. The disruptive induction of eddy currents is avoided.

In one embodiment, the shielding is provided for an electronic circuit in an MRT system. The electronic circuit may be connected with a magnetic resonance receive antenna of the MRT system lying outside the shielding.

The substrate used in the shielding may include a dielectric (e.g., non-conductive) material. For example, this involves a high-frequency-proof substrate (e.g., with a dielectricity constant homogeneous over the desired frequency range). Further materials that may be used for the substrate are ceramics (e.g., aluminum oxide, polymers, Teflon, a glass fiber structure such as FR4, or prepreg).

In one embodiment, a non-ferromagnetic material is used as the metal for the metal structure. In some embodiment, metals for the metal structure are gold, silver, copper, aluminum, or combinations of these metals.

In one embodiment, the serpentine boundary line runs at right angles and/or in curves.

In another embodiment, the metal structure forms a pattern including a plurality of identically-structured surface elements that are embodied and disposed next to one another such that the non-contiguous part areas are formed by the structures. In this way, a fractal structuring through the repeated surface elements is achieved. The fractal structuring may be fabricated in a simple manner (e.g., with known printed circuit board processes). In such cases, a respective structured surface element may be embodied as rectangular (e.g., square).

In a development of the shielding, at the respective edges of a respective structured surface element, one or more sections of the boundary line run into the structured surface element. A respective section of the boundary line extends from a position on the corresponding edge to another position of the corresponding edge. The edge is to be understood as a virtual edge that delimits the individual surface elements from one another. By contrast to the boundary line, this edge is not actually embodied in the metal structure.

In one embodiment, a finger extending into the corresponding edge is formed by a respective section of the boundary line. The fingers on the same edge may have different lengths. By correspondingly defining different lengths of the fingers, the shielding may be flexibly adapted to different usage purposes by variation of the capacitance between the part areas.

A good attenuation affect is achieved in the shielding by a respective metal structure being disposed on both sides of the at least one substrate. For part areas overlapping when viewed from above the substrate, this produces a capacitive coupling by the substrate. The attenuation affect may be further improved by the shielding including a plurality of substrates lying above one another. A metal structure is disposed between adjacent sides of at least one pair (e.g., of all pairs of adjacent substrates). In one embodiment, a respective metal structure is also disposed on the upper side of the topmost substrate and/or on the lower side of the lowest substrate of the plurality of substrates lying above one another.

In a further embodiment, two adjacent metal structures that are separated from one another by a substrate are configured such that the part areas of the adjacent metal structures, looking down from above onto the plane of the substrate, are offset from one another. This enables the capacitive coupling between part areas of adjacent metal structures to be increased.

In an embodiment, the metal structure is connected to a ground of the electronic circuit to be shielded.

In a further embodiment, the shielding is disposed such that the shielding at least partly covers the electronic circuit and thereby shields the electronic circuit.

In one embodiment, an electronic circuit (e.g., for an MRT system) such as, for example, an A/D converter or an FPGA, is provided. The electronic circuit is provided with the shielding.

In another embodiment, an MRT system with at least one of the circuits is provided.

DETAILED DESCRIPTION OF THE DRAWINGS

Figure 1:
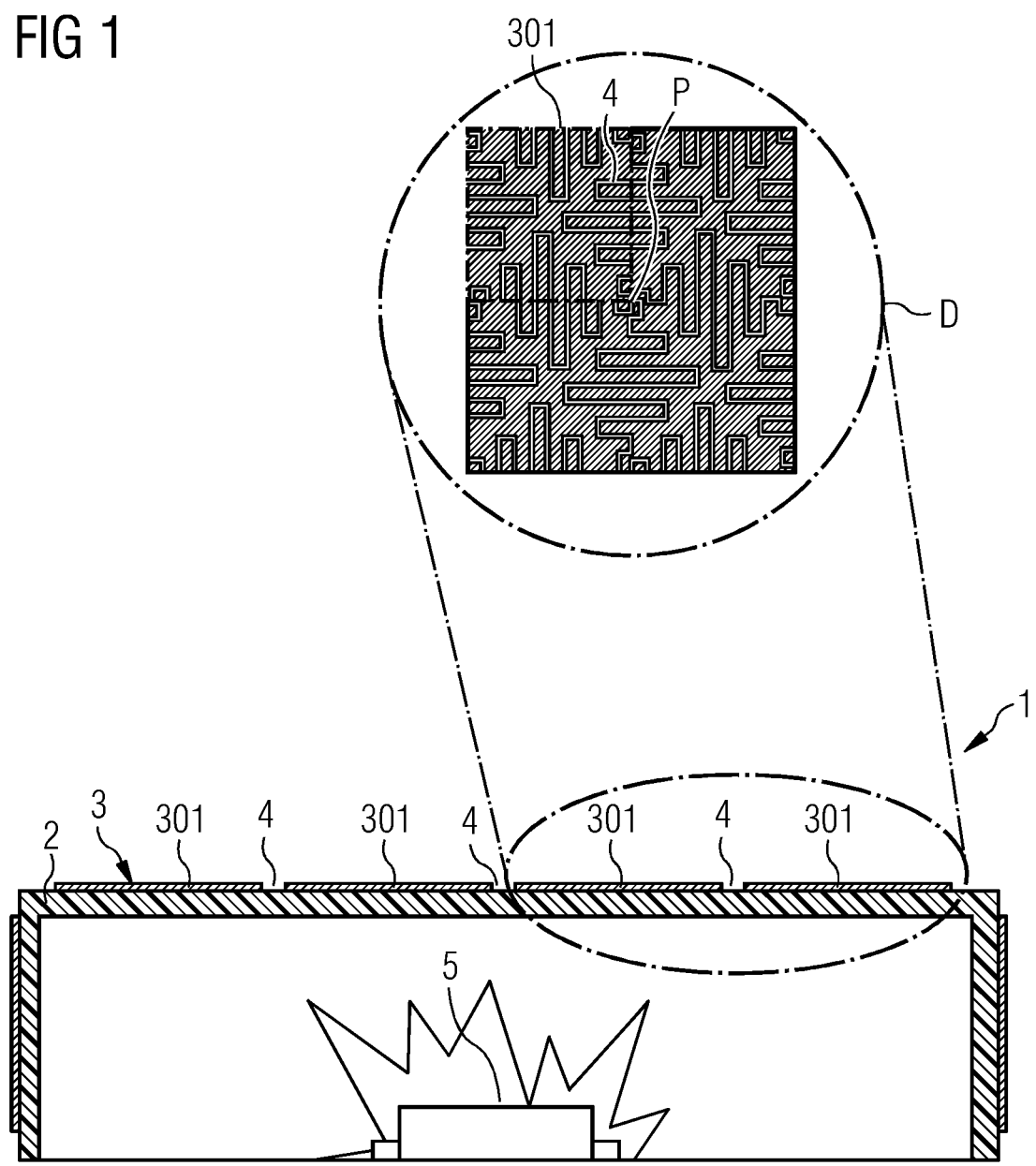
FIG. 1 shows one embodiment of a structure shielding an interferer.

FIG. 1 shows a side view of an exemplary embodiment of shielding 1 in the form of a rectangular box, with which an interferer 5 in the form of an electronic circuit is shielded from components outside the shielding. In one or more of the exemplary embodiments described, the shielding is used in a magnetic resonance tomography (MRT) system. The electronic circuit 5 is connected to a magnetic resonance receive antenna (not shown), which receives MR signals of the magnetic resonance tomograph and processes the MR signals further. The electronic circuit may include an A/D converter.

The shielding 1 prevents frequencies or frequency portions in the MR band that are emitted by the electronic circuit 5 interfering with the highly-sensitive receive antenna. The result thus achieved is that the high-frequency magnetic resonance frequencies are shielded out by the shielding. The shielding is transparent for the low-frequency magnetic gradient fields of the MRT system, through which the induction of eddy currents in the shielding and through this image faults in the magnetic resonance tomography are avoided.

In the embodiment of FIG. 1, the shielding 1 includes a dielectric substrate 2 that includes a glass fiber composite material (e.g., FR4). Provided on an upper surface of the substrate 2 is a metallic structure 3 that is formed from a non-ferromagnetic metal (e.g., copper). The metal structure is configured such that non-contiguous part areas are formed on an upper side of the substrate 2. The non-contiguous part areas are separated from one another via boundary lines running a serpentine shape. The boundary lines thus represent spacings between adjacent part areas, at which no metal of the metal structure is located. The non-contiguous part areas are formed via a structure made of a plurality of fractal surface elements 301 adjoining one another. Known printed circuit board processes such as, for example, etching, photolithography and the like may be used for the structuring.

FIG. 1 further shows a detailed view D that reproduces a square section of the metal structure 3 shown from above. In accordance with this detailed view, dark areas are formed by the corresponding metal of the metal structure, while the light areas represent the corresponding boundary lines 4. As shown in FIG. 1, in the section of the detailed view shown, four boundary lines at each edge of the section run in a serpentine shape inwards to a central point P. The structure continues in such cases at each edge of the section by repetition of the square shown, so that part areas at each edge have a serpentine-shaped boundary line. The surface of the metal structure 3 may be described on the basis of corresponding fractal surface element 301. In the detailed view D, one of the surface elements is highlighted by a surrounding line in the left-hand upper corner of the square section. In total, the square section of the metal structure contains four of these surface elements 301. This structure of the surface elements repeats in the overall surface of the metal structure. The surface elements are combined at edges so that boundary lines 4 running in a serpentine shape are formed.

Figure 2:
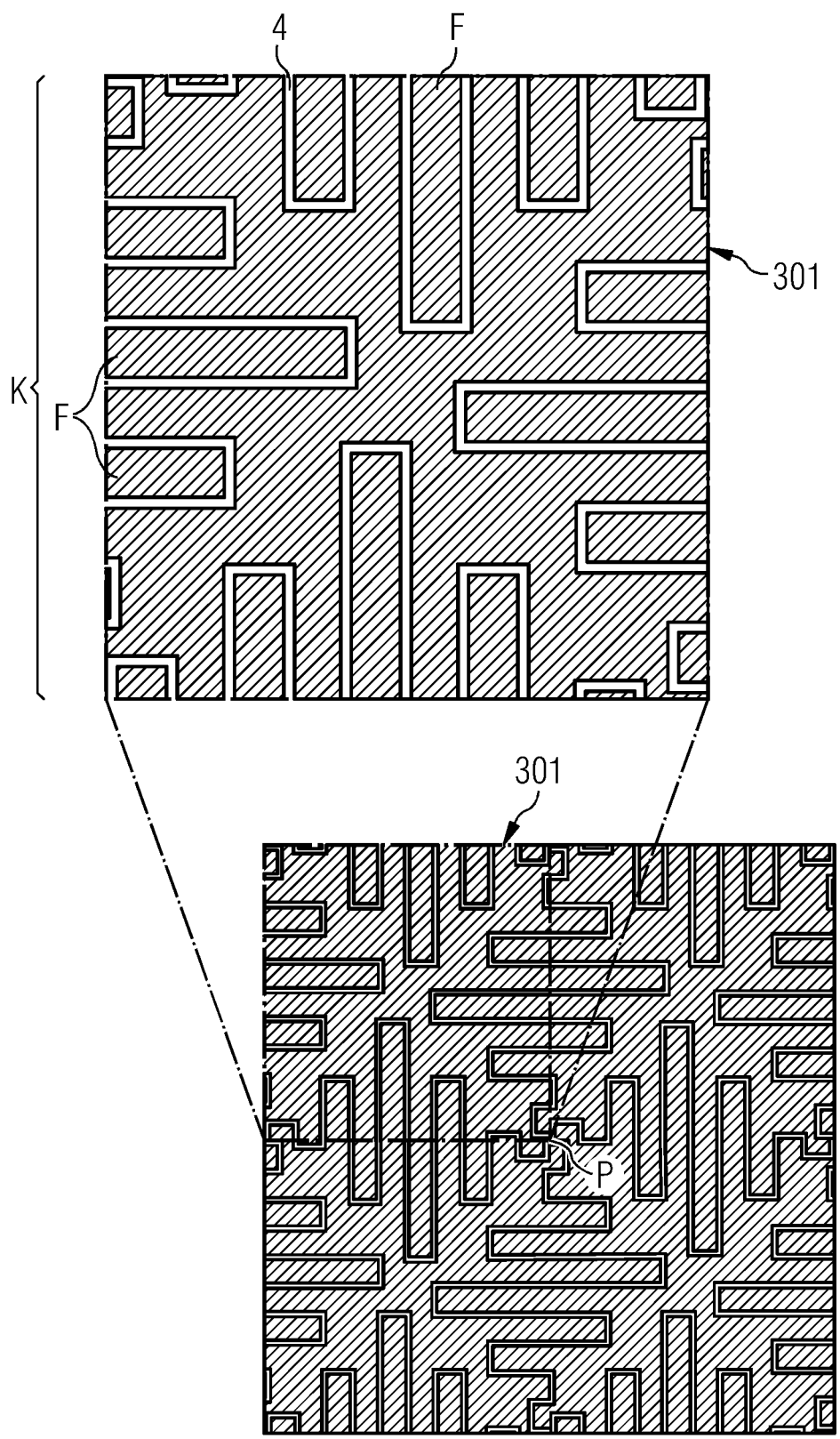
FIG. 2 shows an enlarged diagram of fractal surface elements shown in FIG. 1.

FIG. 2 shows an enlarged view of the section of the metal structure from FIG. 1. A single surface element 301 is shown larger. FIG. 2 shows that this surface element is embodied in the form of a square. One of the edges of the square is labeled with the reference character K. Depending on the embodiment, the square may differ in size. In one embodiment, the length of the edge of the square lies between 5 mm and 5 cm. By contrast, the boundary line may have a width of between 1 mm and 1 cm.

As shown in FIG. 2, a surface element 301 is structured such that, at each edge of the surface element, a plurality of sections of the serpentine boundary line extend into the surface element and out again. Five fingers F, for example, are formed in each case on each edge (only labeled with reference characters in some cases) through the plurality of sections of the serpentine boundary line. The fingers of edges adjoining one another are arranged disposed offset from one another in order to embody the serpentine boundary line in this way. The result achieved by the boundary lines 4 is that the capacitance between the individual part areas is greatly increased, so that, without use of discrete capacitive components between the part areas, a sufficient attenuation is provided for the MR frequency band. Thus, no additional components are to be provided for the shielding. This provides that the component placement outlay is significantly reduced. This simultaneously achieves the result of the shielding being transparent for the lower-frequency gradient fields of the MRT system.

Figure 3:
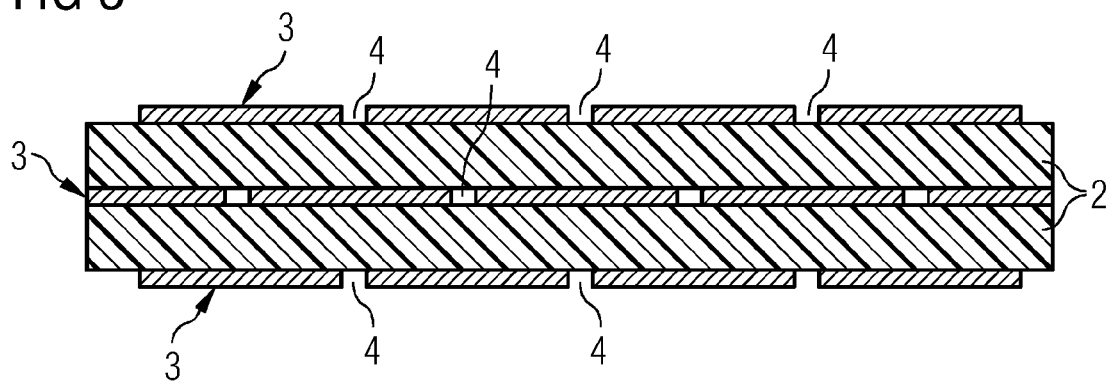
FIG. 3 shows one embodiment of shielding.

FIG. 3 shows a cross-sectional view of a section of one embodiment of shielding. By contrast with the embodiment of FIG. 1, this shielding includes two substrates 2 lying one above the other. Each of the two substrates 2 includes dielectric material. Embodied on an upper side of an upper substrate, on a lower side of a lower substrate and also between the two substrates are corresponding metal structures 3. The layout of the metal structures 3 corresponds to the metal structure 3 from FIG. 1. This provides that each of the metal structures is formed from a plurality of part areas that are separated from one another by serpentine-shaped boundary lines. For reasons of clarity, just a few of the boundary lines are labeled with the reference number 4 in FIG. 3. In accordance with the embodiment of FIG. 3, not only adjacent part areas within a metal structure are capacitively coupled, but capacitive coupling also exists between part areas of adjacent metal structures spaced apart via a substrate. The part areas of the adjacent metal structures overlap with one another when viewed looking down onto the substrate from above.

Figure 4:
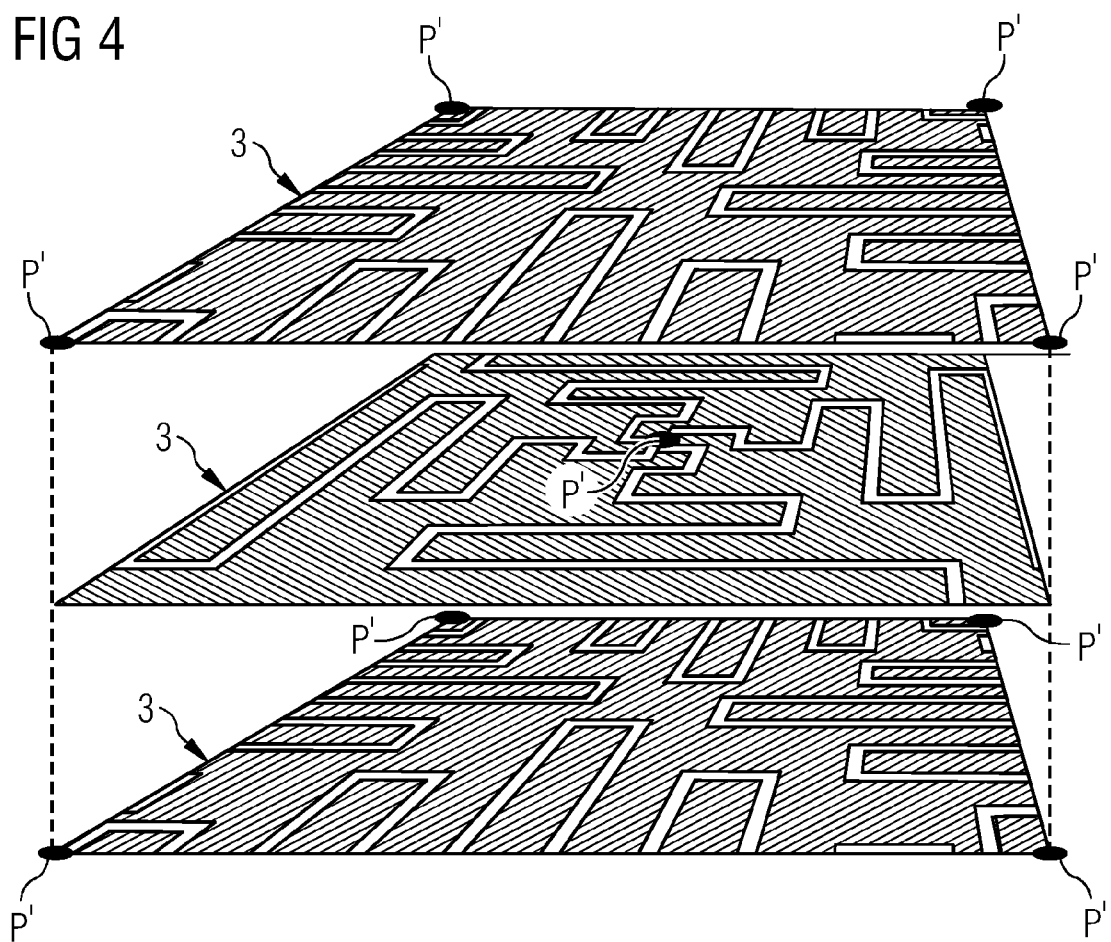
FIG. 4 shows the arrangement of fractal surface elements in the shielding in accordance with FIG. 3.

The individual metal structures 3 of FIG. 3 are disposed offset from one another, as shown by the perspective view in FIG. 4. FIG. 4 shows a section of the three metal structures lying one above the other. The relative positions of the metal structures in relation to one another are clarified by the points P'. When the points P' of different metal structures viewed looking down onto the substrate from above lie above one another, the metal structures 3 overlap with one another (e.g., overlap exactly). Otherwise, the metal structures 3 are offset from one another. As shown in FIG. 4, metal structures 3 adjacent to one another are disposed offset from one another (e.g., a lowest metal structure is positioned offset from a central metal structure, and the central metal structure is positioned offset from an upper metal structure). The lowest and the topmost metal structure are not disposed offset from one another. With this offset positioning of adjacent metal structures, a high capacitance between the individual part areas and thus a very good attenuation for high-frequency fields may be achieved.

The embodiments of the shielding described above have a number of advantages. For example, the specific fractal structuring of the metal structure achieves a shielding effect down into the lower MHz frequency range without additional capacitive components having to be provided. The metallic structure is also transparent for lower frequencies, through which eddy currents are avoided in the metal structure. A multilayer layout of the shielding enables this to be flexibly adapted for different areas of application. The shielding effect is improved by this for high-frequency frequency portions.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A shielding for an electronic circuit, the shielding comprising:
a substrate; and
a metal structure disposed on a side of the substrate, the metal structure comprising a plurality of non-contiguous part areas,
wherein adjacent part areas of the plurality of non-contiguous part areas disposed on a same side of the substrate are physically separated from one another via a boundary line running in a serpentine shape, wherein the boundary line provides a spacing between the adjacent parts at which no metal of the metal structure is located; wherein the adjacent part areas are coupled capacitively with one another via the boundary line running in the serpentine shape.

2. The shielding as claimed in claim 1, wherein the substrate and the metal surface are used with an electronic circuit in a magnetic resonance tomography (MRT) system.

3. The shielding as claimed in claim 2, wherein the electronic circuit is linked to a magnetic resonance receive antenna of the MRT system located outside the shielding.

4. The shielding as claimed in claim 1, wherein the substrate comprises a high-frequency-proof substrate, a ceramic, a polymer, a glass fiber structure, prepreg, a dielectric non-conductive material, or a combination thereof.

5. The shielding as claimed in claim 1, wherein the metal structure comprises non-magnetic material.

6. The shielding as claimed in claim 1, wherein the metal structure comprises gold, silver, copper, aluminum, or a combination thereof.

7. The shielding as claimed in claim 1, wherein the boundary line running in the serpentine shape runs at right angles, in curves, or at right angles and in curves.

8. The shielding as claimed in claim 1, wherein the metal structure provides a pattern of a plurality of identically-structured surface elements configured and disposed next to one another such that the plurality of non-contiguous part areas is provided by the plurality of identically-structured surface elements.

9. The shielding as claimed in claim 8, wherein a structured surface element of the plurality of identically-structured surface elements is rectangular.

10. The shielding as claimed in claim 9, wherein the structured surface element is square.

11. The shielding as claimed in claim 8, wherein, at respective edges of a structured surface element of the plurality of identically-structured surface elements, one or more sections of the boundary line run into the structured surface element, and wherein a respective section of the boundary line extends from a position on the corresponding edge to another position of the corresponding edge.

12. The shielding as claimed in claim 11, wherein a finger of the plurality of fingers extending into the corresponding edge is formed by the respective section of the boundary line, and wherein two or more fingers of the plurality of fingers at a same edge are of different lengths.

13. The shielding as claimed in claim 1, wherein the metal structure is a first metal structure, wherein the shielding comprises a plurality of metal structures, the plurality of metal structures comprising the first metal structure and a second metal structure, and wherein the first metal structure is disposed on a first side of the substrate, and the second metal structure is disposed on a second side of the substrate, the side being the first side or the second side.

14. The shielding as claimed in claim 1, further comprising a plurality of substrates lying one above the other, the plurality of substrates comprising the substrate, wherein the metal structure is disposed between adjacent sides of a pair of adjacent substrates of the plurality of substrates, wherein the metal structure is disposed on an upper side of a topmost substrate of the plurality of substrates, on a lower side of a bottommost substrate of the plurality of substrates, or on the upper side of the topmost substrate and on the lower side of the bottommost substrate so that a capacitive coupling is produced by a substrate of the plurality of substrates in an area of overlapping part areas.

15. The shielding as claimed in claim 13, wherein two adjacent metal structures of the plurality of metal structures that are separated from one another via a substrate are configured such that the part areas of the adjacent metal structures, when viewed looking down onto a plane of the substrate from above, are offset in relation to one another.

16. The shielding as claimed in claim 2, wherein the metal structure is connected to a ground of the electronic circuit to be shielded.

17. The shielding as claimed in claim 2, wherein the shielding is disposed such that the shielding at least partly covers the electronic circuit.

18. An electronic circuit comprising:
a shielding comprising:
a substrate, wherein a metal structure is disposed on at least one side of the substrate, the metal structure comprising a plurality of non-contiguous part areas,
wherein adjacent part areas of the plurality of non-contiguous part areas disposed on a same side of the substrate are separated from one another via a boundary line running in a serpentine shape, wherein the boundary line provides a spacing between the adjacent parts at which no metal of the metal structure is located, wherein the adjacent part areas are coupled capacitively with one another via the boundary line running in the serpentine shape.

19. The electronic circuit as claimed in claim 18, wherein the substrate comprises a high-frequency-proof substrate, a ceramic, a polymer, a glass fiber structure, prepreg, a dielectric non-conductive material, or a combination thereof.

20. A magnetic resonance tomography (MRT) system comprising:
an electronic circuit comprising:
a shielding comprising:
a substrate, wherein a metal structure is disposed on at least one side of the substrate, the metal structure comprising a plurality of non-contiguous part areas,
wherein adjacent part areas of the plurality of non-contiguous part areas that are disposed on a same side of the substrate are spaced apart from one another via a boundary line running in a serpentine shape, wherein the metal structure forms a fractal pattern.

21. The shielding as claimed in claim 1, wherein the boundary line comprises a non-conductive material.

* * * * *